(12) United States Patent
Kossel et al.

(10) Patent No.: US 10,454,723 B1
(45) Date of Patent: Oct. 22, 2019

(54) DECISION FEEDBACK EQUALIZER

(71) Applicant: International Business Machines Corporation, Armonk, NY (US)

(72) Inventors: Marcel A. Kossel, Reichenburg (CH); Vishal Khatri, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/033,704

(22) Filed: Jul. 12, 2018

(51) Int. Cl.
*H03H 7/30* (2006.01)
*H04L 25/03* (2006.01)
*G11C 11/4093* (2006.01)
*G11C 11/4076* (2006.01)

(52) U.S. Cl.
CPC .... *H04L 25/03057* (2013.01); *G11C 11/4076* (2013.01); *G11C 11/4093* (2013.01)

(58) Field of Classification Search
CPC .......... H04L 25/03057; G11C 11/4076; G11C 11/4093
USPC ......................................................... 375/344
See application file for complete search history.

(56) References Cited

U.S. PATENT DOCUMENTS

| | | | | |
|---|---|---|---|---|
| 5,852,630 A | * | 12/1998 | Langberg | ............ H04L 27/2647 375/219 |
| 9,542,991 B1 | | 1/2017 | Xie et al. | |
| 9,973,356 B1 | * | 5/2018 | Livne | ................ H04L 25/03057 |
| 2001/0042216 A1 | * | 11/2001 | Jung | ................... G06F 13/1668 713/300 |
| 2010/0103998 A1 | * | 4/2010 | Erba | ................... H04L 25/0307 375/233 |
| 2012/0269255 A1 | * | 10/2012 | Pelteshki | .......... H04L 25/03146 375/233 |
| 2015/0319015 A1 | * | 11/2015 | Malhotra | .............. H04L 7/0029 375/233 |
| 2016/0149732 A1 | * | 5/2016 | Amirkhany | ......... H04L 25/0292 375/233 |
| 2016/0241421 A1 | * | 8/2016 | Lim | .................... H04L 25/0272 |
| 2016/0371159 A1 | | 12/2016 | Meaney et al. | |
| 2018/0173461 A1 | * | 6/2018 | Carroll | .................. G06F 3/0659 |
| 2018/0248577 A1 | * | 8/2018 | Hossain | ............ H04L 25/03057 |

OTHER PUBLICATIONS

"Proposed DDR5 SDRAM Decision Feedback Equalization (DFE) R3" JEDEC 2011, Ballot Template Version draft rev. Aug. 2011.

* cited by examiner

*Primary Examiner* — Dhaval V Patel
(74) *Attorney, Agent, or Firm* — Harrington & Smith

(57) ABSTRACT

Embodiments relate to a decision feedback equalizer configured for a half-rate operation. The decision feedback equalizer includes a single summer stage and a direct feedback path configured to provide feedback to the single summer stage. The decision feedback equalizer further includes an even sampler configured to sample even data of an output signal of the single summer stage, an odd sampler configured to sample odd data of the output signal of the single summer stage and a plurality of 2:1 multiplexers arranged in the direct feedback path. The plurality of 2:1 multiplexers are configured to feed the even and odd data in an alternating manner back to the single summer stage, thereby adapting the feedback to the half-rate operation of the decision feedback equalizer. A corresponding memory system and design structure are also provided.

18 Claims, 5 Drawing Sheets

DECISION FEEDBACK EQUALIZER

TECHNICAL FIELD

The present invention relates to a decision feedback equalizer, and further relates to a corresponding system and a corresponding design structure.

BACKGROUND

Double data rate (DDR) memory links use burst-mode signaling, which means that data is transmitted in bursts of several bytes and in between these transmission bursts the transmitter is either in termination mode for the reception of data from the DRAM or in idle mode, the latter providing a high impedance state. DDR links are operated source-synchronously with unidirectional clocks and bidirectional data buses that are operated in half-duplex mode.

Intersymbol Interference (ISI) is a major source of jitter for high-speed serial links. There are a number of equalizer types known that may be applied to both transmitters and receivers of such links to reduce or eliminate the effect of ISI. Among these equalizers, decision feedback equalizers (DFEs) are widely-used discrete-time equalizers. A decision feedback equalizer stores and feeds back the decisions it has made for the previous bits and subtracts the ISI of these stored bits from the current signal.

Up to the DDR-4 standard, DFEs have not been used in DDR receivers because the data rate dependent eye closure due to ISI has been too little for the justification of a DFE and older standards such as DDR-4 through DDR-2 did not provide any DFE support in their transmission protocols. With the increase of data rate from 3.2 Gb/s for DDR-4 to 6.4 Gb/s for DDR-5, DFEs have now become part of the JEDEC standard for DRAM suppliers.

Hence there is a need for advantageous decision feedback equalizer circuits.

BRIEF SUMMARY

According to a first aspect, the present invention is embodied as a decision feedback equalizer configured for a half-rate operation. The decision feedback equalizer comprises a single summer stage and a direct feedback path configured to provide feedback to the single summer stage. The decision feedback equalizer further comprises an even sampler configured to sample even data of an output signal of the single summer stage, an odd sampler configured to sample odd data of the output signal of the single summer stage and a plurality of 2:1 multiplexers arranged in the direct feedback path. The plurality of 2:1 multiplexers are configured to feed the even and odd data in an alternating manner back to the single summer stage, thereby adapting the feedback to the half-rate operation of the decision feedback equalizer. According to embodiments, the plurality of 2:1 multiplexers use a half rate clock signal to feed the even and odd data back to the single summer stage.

According to another aspect, the invention is embodied as a memory system. The memory system comprises a memory controller, a memory module and a memory bus arranged between the memory controller and the memory module. The memory controller comprises a decision feedback equalizer according to the first aspect.

According to yet another aspect, the invention can be embodied as a design structure tangibly embodied in a machine readable medium for designing, manufacturing, or testing an integrated circuit. The design structure comprises a decision feedback equalizer according to the first aspect.

Devices and methods embodying the present invention will now be described, by way of non-limiting examples, and in reference to the accompanying drawings. Technical features depicted in the drawings are not necessarily to scale. Also, some parts may be depicted as being not in contact to ease the understanding of the drawings, whereas they may very well be meant to be in contact, in operation.

DETAILED DESCRIPTION

Figure 1:
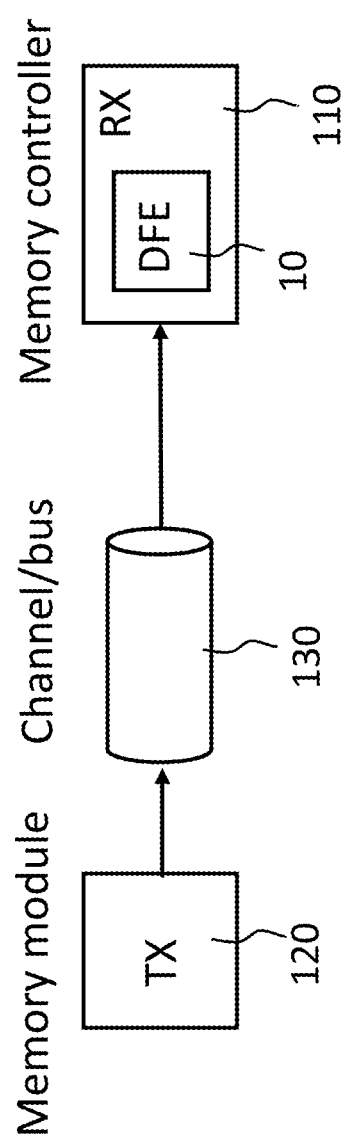
FIG. 1 shows a schematic block diagram of a memory system according to an embodiment of the invention.

FIG. 1 shows a schematic block diagram of a memory system 100 for READ transmissions according to an embodiment of the invention. The memory system 100 comprises a receiver within a memory controller 110, a memory module 120 and a memory bus 130, which may also be denoted as memory channel, arranged between the memory controller 110 and the memory module 120. The memory controller comprises a decision feedback equalizer (DFE) 10. The memory module 120 may be in particular a double data rate (DDR) memory module and in particular a DDR memory module according to the Joint Electron Device Engineering Council (JEDEC) DDR-5 standard. The Joint Electron Device Engineering Council is now also denoted as the Solid State Technology Association.

According to the JEDEC document JC42.3B "Proposed DDR5 SDRAM Decision Feedback Equalization (DFE) R3", a decision feedback equalizer is located in the DQ data path and clocked by the source synchronous DQS clock to remove post-cursor intersymbol-interference (ISI) from the memory channels, which typically have moderate attenuation (<15 dB at Nyquist frequency), but strong reflections due to the T-junctions of the multi-drop buses. Because of the high number of parallel links in memory channels it is desired that the DFE has low power consumption and small area. Less important is speed since memory links are usually operated at a much slower data rate (e.g. 4.4 Gb/s) than high-speed serial links (e.g. 32 Gb/s).

According to embodiments of the invention a direct feedback path is used in the DFE as no loop unrolling or speculation is required for DDR DFEs because of the relatively low speed. Embodiments of the invention aim at moving the ISI associated to each post-cursor tap position to a place towards the sampling point (which is typically in the middle of the bit time) where it gets cancelled. Mathematically, the DFE operation can be described as $$q_{sum}[k] = r[k] - \sum_{j=1}^{N} h_j q[k-j]$$

wherein $q_{sum}[k]$ is the sampled summer output, $r[k]$ is the received signal in the discrete time domain, $q[k-j]$ is the j-th post-cursor bit and $h_j$ is the j-th post-cursor tap weight. DFEs cannot cancel pre-cursor ISI as this would be acausal.

Figure 2:
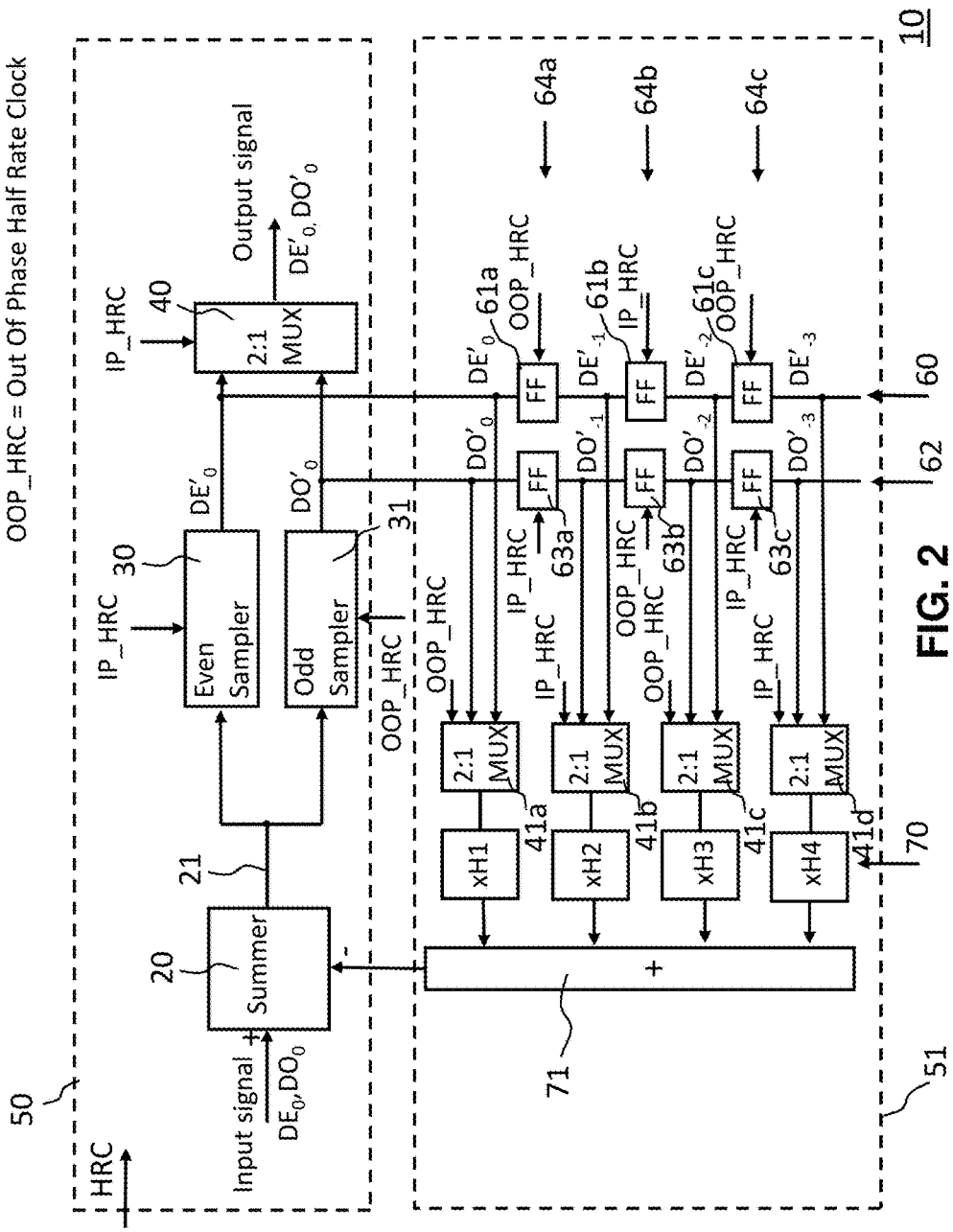
FIG. 2 shows an exemplary block diagram of a decision feedback equalizer according to an embodiment of the invention.

FIG. 2 shows an exemplary block diagram of a decision feedback equalizer 10 according to an embodiment of the invention.

The decision feedback equalizer 10 is configured for a half-rate operation and comprises a single summer stage 20, which may also be denoted as summer 20. The decision feedback equalizer 10 comprises a main path 50 and a direct feedback path 51 configured to provide feedback to the single summer stage 20. The main path 50 comprises an even sampler 30 which is configured to sample even data of an output signal 21 of the single summer stage 20, and an odd sampler 31 which is configured to sample odd data of the output signal 21 of the single summer stage 20. The decision feedback equalizer 10 receives an input signal, also denoted as $DE_0$, $DO_0$ and provides a sampled output signal, denoted as $DE'_0$, $DO'_0$.

The main path 50 comprises a 2:1 multiplexer 40 which is configured to multiplex the even and odd data into the output signal of the decision feedback equalizer 10.

The direct feedback path 51 comprises a plurality of 2:1 multiplexers. More particularly, according to this embodiment four 2:1 multiplexers 41a, 41b, 41c and 41d are provided in the direct feedback path 51, which may be collectively referred to as 2:1 multiplexers 41. The plurality of 2:1 multiplexers 41 are configured to feed the sampled even and odd data in an alternating manner back to the single summer stage 20. This adapts the feedback to the half-rate operation of the decision feedback equalizer 10 which will be explained below in more detail.

Furthermore, the direct feedback path 51 comprises a first string 60 of delay units for the even data and a second string 62 of delay units for the odd data. Each delay unit provides a delay of 2 unit intervals (2 UI) to the pertinent even and odd data streams that are then used for the ISI subtraction at the corresponding delay position. Both the first string 60 of delay units and the second string 62 of delay units are configured to operate at half rate. More particularly, according to this embodiment the first string 60 comprises three delay units 61a, 61b and 61c, which may be collectively referred to as delay units 61. Furthermore, the second string 62 comprises three delay units 63a, 63b and 63c, which may be collectively referred to as delay units 63. The delay units 61, 63 may be in particular embodied as D flip-flops.

The first delay unit 61a of the first string 60 and the first delay unit 63a of the second string 62 form a first delay stage 64a that is coupled to the second multiplexer 41b.

The second delay unit 61b of the first string 60 and the second delay unit 63b of the second string 62 form a second delay stage 64b that is coupled to the third multiplexer 41c. The third delay unit 61c of the first string 60 and the third delay unit 63c of the second string 62 form a third delay stage 64c that is coupled to the fourth multiplexer 41d.

The direct feedback path comprises a plurality of weighting units 70 for weighting the feedback, in this embodiment 4 weighting units providing a weight H1, H2, H3 and H4.

The weighting units 70 receive the output signals of the 2:1 multiplexers 41 and provide a weighted feedback via a summation stage 71 back to the single summer stage 20.

The decision feedback equalizer 10 operates at half rate. In other words, it receives a half rate clock signal HRC according to which the incoming data is sampled at both the rising and the falling edge of the half rate clock signal HRC. The even sampler 30 is operated with the in-phase component IP_HRC of the half rate clock signal HRC, e.g. with the rising edge of the half rate clock signal. The odd sampler 31 is operated with the out-of-phase component OOP_HRC of the half rate clock signal HRC, e.g. with the falling edge of the half rate clock signal HRC. Accordingly, IP_HRC and OOP_HRC are a pair of differential half rate clocks. In other words, IP_HRC and OOP_HRC may also be defined as true and complementary versions of half rate clocks. The clocking of the direct feedback path 51 is performed as follows. The plurality of 2:1 multiplexers 41 of the direct feedback path 51 are clocked in an alternating manner with the in-phase component IP_HRC of the half rate clock signal HRC and the out-of-phase component OOP_HRC of the half rate clock signal HRC. In other words, a first one of the multiplexers 41, in this example the multiplexer 41a, receives the out-of-phase component OOP_HRC of the half rate clock signal HRC, the next one of the multiplexers 41, in this example the multiplexer 41b, receives the in-phase component IP_HRC of the half rate clock signal HRC, a next one of the multiplexers 41, in this example the multiplexer 41c, receives the out-of-phase component OOP_HRC of the half rate clock signal HRC and the next one of the multiplexers 41, in this example the last multiplexer 41d, receives the in-phase component IP_HRC of the half rate clock signal HRC.

Furthermore, the delay units 61 of the first string 60 and the delay units 63 of the second string 62 are clocked in an alternating manner with the in-phase component IP_HRC of the half rate clock signal HRC and the out-of-phase component OOP_HRC of the half rate clock signal HRC.

More particularly, the first delay unit 61a of the first delay stage 64a is clocked with the out-of-phase component OOP_HRC of the half rate clock signal, while the first delay unit 63a of the first delay stage 64a is clocked with the in-phase component IP_HRC of the half rate clock signal.

The second delay unit 61b of the second delay stage 64b is clocked with the in-phase component IP_HRC of the half rate clock signal, while the second delay unit 63b of the second delay stage 64b is clocked with the out-of-phase component OOP_HRC of the half rate clock signal.

And the third delay unit 61c of the third delay stage 64c is clocked with the out-of-phase component OOP_HRC of the half rate clock signal HRC, while the third delay unit 63c of the third delay stage 64c is clocked with the in-phase component IP_HRC of the half rate clock signal HRC.

Figure 3:
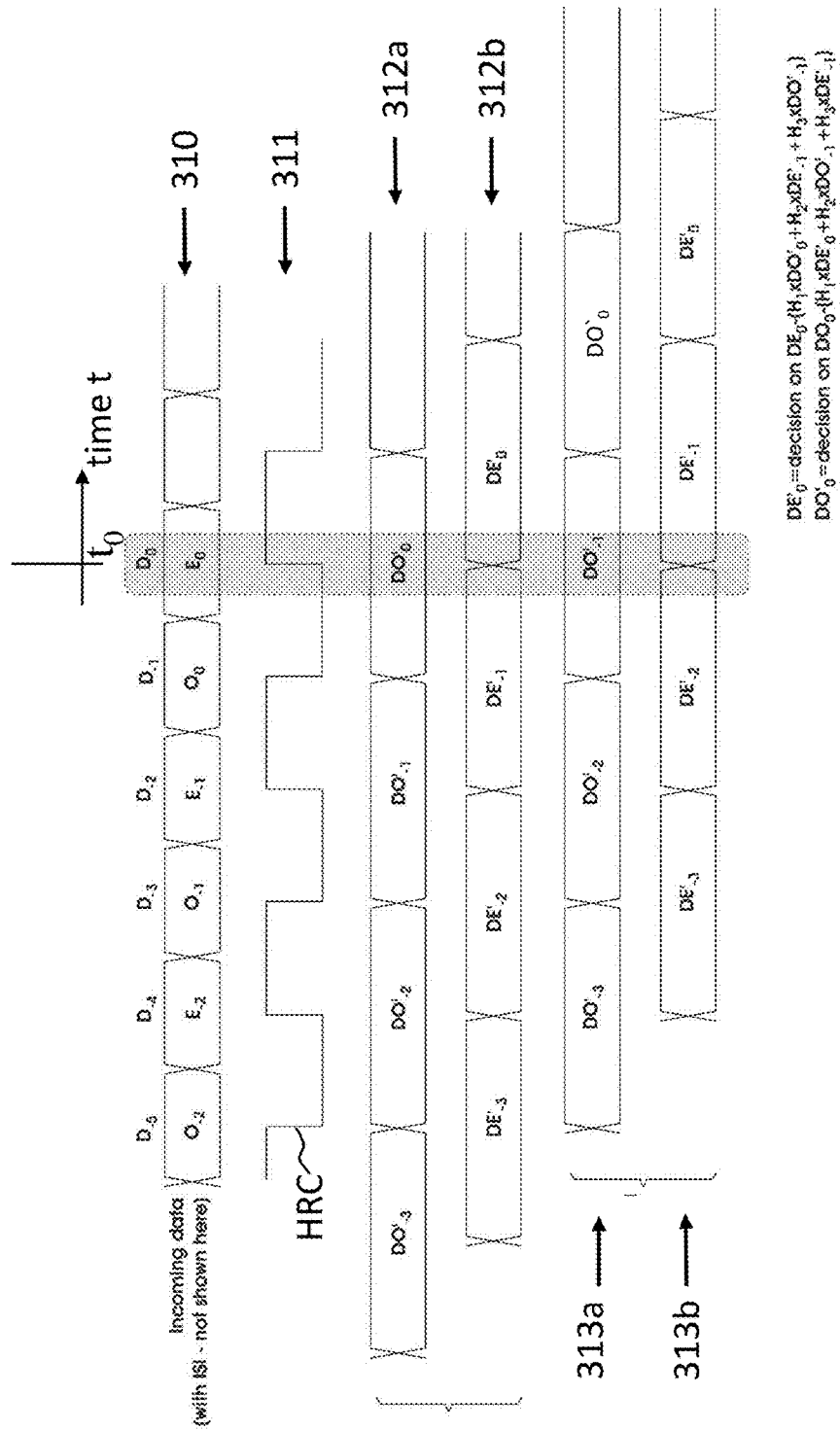
FIG. 3 shows a timing diagram of incoming data of the decision feedback equalizer of FIG. 2.

In the following the timing and clocking scheme of the half-rate operation of decision feedback equalizers according to embodiments of the invention is illustrated with reference to FIGS. 2 and 3, wherein FIG. 3 shows a timing diagram of incoming data of the decision feedback equalizer 10 of FIG. 2.

An incoming full-rate data stream 310 comprises a stream of data bits $D_0$, $D_{-1}$, $D_{-2}$, wherein Do denotes the current or latest bit on which a decision has to be taken at a time $t_0$. The incoming data stream 310 may comprise intersymbol interference (ISI), which is not explicitly shown in FIG. 3 and which shall be removed by the decision feedback equalizer 10. The decision feedback equalizer 10, which shall take the decisions on the stream of bits, is clocked with a half rate signal HRC, which is also denoted as half rate clock signal 311. The half rate clock signal 311 triggers the decisions with the falling edge as well as with the rising edge of the half rate clock signal 311.

More particularly, the incoming data stream is sampled by the even sampler 30 and the odd sampler 31 in an alternating way, wherein the even sampler 30 is triggered by the rising edge corresponding to IP_HRC and the odd sampler 31 by the falling edge corresponding to OOP_HRC. Accordingly, the even sampler 30 samples the bits $D_0$, $D_{-2}$ and $D_{-4}$, while the odd sampler 31 samples the bits $D_{-1}$, $D^{-3}$ and $D^{-5}$. Accordingly, the bit $D_0$ of the incoming full-rate data stream may also be denoted as even data bit $DE_0$ and the bit $D_{-1}$ as odd data bit $DO_0$.

The diagram 312a illustrates the output signals $DO'_x$ of the odd sampler 31, wherein x is the respective point in time.

The diagram 312b illustrates the output signals $DE'_x$ of the even sampler 30, wherein x is the respective point in time.

The diagram 313a illustrates the output signals $DO'_x$ of the first delay unit 63a of the second string 62, wherein x is the respective point in time.

The diagram 313b illustrates the output signals $DE'_x$ of the first delay unit 61a of the first string 60, wherein x is the respective point in time.

The decisions $DE'_0$, $DO'_0$ that are taken by the even sampler 30 and the odd sampler 31 respectively at a point in time $t_0$ are determined as follows:

$$DE'_0 = \text{decision on } DE_0\_(H1 \times DO'_0 + H2 \times DE'_{-1} + H3 \times DO'_{-1} + H4 \times DE'_{-2}) \text{ and}$$

$$DO'_0 = \text{decision on } DO_0\_(H1 \times DE'_0 + H2 \times DO'_{-1} + H3 \times DE'_{-1} + H4 \times DO'_{-2}),$$

wherein $DE_0$ and $DO_0$ represent the even and odd input signals respectively of the DFE which may comprise ISI. Furthermore, H1, H2, H3 and H4 represent the weights of the weighting units 70.

Figure 4:
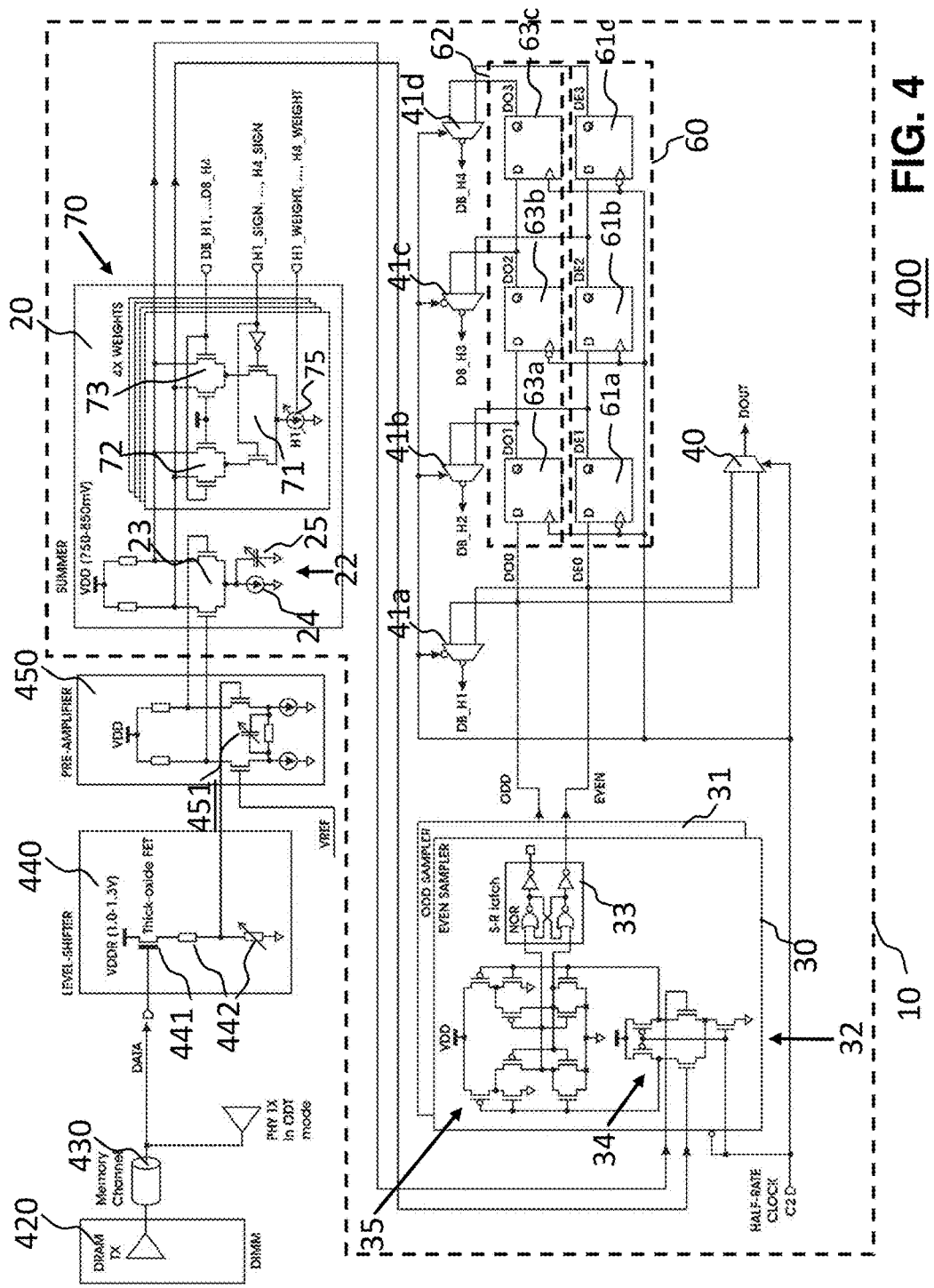
FIG. 4 shows a more detailed embodiment of a memory system according to an embodiment of the invention.

FIG. 4 shows a more detailed embodiment of a memory system 400 according to an embodiment of the invention. The memory system 400 depicted in READ mode comprises a decision feedback equalizer 10 and a memory module 420, in particular a DIMM 420. The memory module 420 is coupled via a memory channel 430 to a level shifter 440. The level shifter 440 establishes a level translator from memory supply to logic supply. More particularly, it converts a voltage level of the memory module 420, i.e. a voltage level of VDDR from 1.0 V to 1.3 V to a logic voltage level VDD of 750-850 mV. The logic voltage level is defined by the voltage level of logic components of a memory controller into which the decision feedback equalizer 10 may be integrated. Hence according to such an embodiment the decision feedback equalizer 10 is configured to operate with the logic voltage level of the corresponding memory controller. The level conversion from VDDR to VDD is advantageous for power saving reasons but also because of the fact that the maximum reliability voltage of more advanced logic CMOS processes is smaller than VDDR and hence the level-shifting protects the I/O circuitries against overvoltages. Between the level-shifter 440 and the decision feedback equalizer 10 there is arranged a preamplifier 450. The level shifter 440 comprises a source follower 441 implemented with thick-oxide transistors for overvoltage protection and a variable resistive voltage divider 442 which is coupled between the source of the source follower and ground. The variable resistive voltage divider 442 can adapt the common mode of the data signal received from the memory module 420 to a desired input range of the preamplifier 450.

The level shifter 440 allows for common mode translation of a VDDR/memory supply voltage (high voltage) to VDD (low voltage)/logic voltage domain. This allows for the proposed DFE to be implemented with regular devices instead of special devices.

The preamplifier 450 comprises a differential pair 451 with source degeneration for gain boosting. More particularly, the preamplifier 450 uses according to the shown embodiment a conventional RC-source degeneration to implement a continuous-time linear-equalizer (CTLE) functionality.

The decision feedback equalizer 10 is configured for a half-rate operation and comprises a single summer stage 20 with integrated weighting units 70. Accordingly, the decision feedback equalizer 10 is in particular suitable for DDR memory links which are based on shipping a source synchronous half-rate clock along with the data on a parallel bus. Such a half-rate DFE architecture according to embodiments of the invention provides the advantage over a full-rate DFE topology because no clock multiplier is required as typically only half-rate or quarter-rate clocks are used on system level for power saving reasons.

The decision feedback equalizer 10 further comprises an even sampler 30, an odd sampler 31, a 2:1 multiplexer 40 of a main path and four 2:1 multiplexers 41a, 41b, 41c and 41d arranged in a direct feedback path of the decision feedback equalizer 10. In addition, a first string 60 of delay units 61 comprises three delay units 61a, 61b and 61c for the even data and a second string 62 comprises three delay units 63a, 63b and 63c is provided. The delay units 61a, 61b and 61c for the even data and 63a, 63b and 63c for the odd data are embodied as D-flip flops. Hence according to the half-rate architecture the output of the single summer stage 20 splits into the even and odd samplers 30, 31, each of them being followed by a string of even and odd D-flip flops operated at half-rate. In order to adapt the feedbacks to the half-rate operation of the D-flip flops, the even and odd data is fed back to the single summer stage via the 2:1 multiplexers 41a, 41b, 41c and 41d.

The single summer stage 20 is embodied as resistor-based summer and comprises a main stage 22. The main stage 22 is configured to convert an input voltage, i.e. the output voltage of the preamplifier 450, to a current. The main stage 22 of the summer comprises a differential pair 23 and a current source 24 coupled between the sources of the differential pair 23 and ground. The gates of the differential pairs 23 are coupled to the output of the preamplifier 450. The drains of the differential pair 23 are coupled resistively via resistors to a supply voltage VDD, in this example a supply voltage VDD in a range between 750 mV and 850 mV. The differential pair 23 forms a common mode logic (CML) stage. In addition, a single, ground-referenced capacitor 25 is arranged for capacitive source degeneration in parallel to the current source 24.

The single summer stage 20 further comprises four weighting units 70 embodied as tap stages. Each of the weighting units 70 is configured to provide a weighted feedback signal. More particularly, each of the weighting units 70 comprise a first differential pair 71 configured to provide a tap sign-bit, more particularly tap sign bits H1_SIGN, H2_SIGN, H3_SIGN and H4 SIGN. In addition, each of the weighting units 70 comprise a second differential pair 72 and a third differential pair 73 connected to the main stage 22 with opposite polarity and configured to add or subtract current to the respective tap stage in dependence on the sign-bit. The effect of this is that the analog data associated to the pertinent tap position moves upwards or downwards and hence cancels its ISI contents—provided the tap weight and sign are chosen correctly.

One of the gates of each differential pair receives feedback signals DB_H1, DB_H2, DB_H3 and DB_H4 from the multiplexers 41a, 41b, 41c and 41d respectively.

The weighting unit 70 is integrated into the single summer stage 20 and provides four weights H1, H2, H3 and H4 for the first 4 post-cursor taps which may be adjusted by an adjustable current source 75.

A single tap weight is composed of the stacking between the respective differential pair 71 for the tap sign bit (e.g., H1_SIGN) and the two parallel differential pairs 72, 73 for the feedback signals from the delay units, (e.g. DB_H1). The sign bit selects between the left- or right-hand side branch of the stacked differential pairs 72, 73.

The differential pairs 72, 73 are configured such that one FET of the pair is always turned on (e.g., gate is connected to VDD). A current change is therefore performed via turning off the other FET of the selected differential pair. The advantage of this scheme is that the tail current source of the weight, which adjusts the magnitude of the tap, gets never turned off completely and hence turn-on delays can be avoided, which may generate undesired glitches.

The single summer stage 20 is coupled to a sampling unit comprising an even sampler 30 and an odd sampler 31. Both the even sampler 30 and the odd sampler 31 comprise a serial connection of a slicer 32 and a set-reset latch 33. The slicer 32 comprises an amplifier stage 34 clocked by a half-rate clock C2 and a self-timed comparator stage 35. The output of the set-reset latch 33 is fed to the first delay units 61a and 63a as well as to the 2:1 multiplexers 40 and 41a. The outputs of the delay units 61 and 63 are fed back to the summer stage 20 where they control the differential pairs 72, 73 and hence close the feedback loop of the DFE 10.

The critical timing path is the one of the H1 tap consisting of the clock-to-output delay of the even/odd samplers 30, 31 plus the feedback delay of the 2:1 multiplexer 41a.

The even data path of the decision feedback equalizer 10 is clocked with the in-phase component of the half-rate clock C2, whereas the odd data path is clocked with the out-of-phase component of the half-rate clock C2.

Hence the architecture according to embodiments of the invention provides additional cross-coupling paths between the data feedbacks. For instance, when the even path samples the incoming data, the H1 tap weight correcting for ISI must come from the odd path since it contains the previous bit in this half-rate sampling scheme. The same applies analogously for the other taps which also alternate between even and odd feedbacks according to their temporal sequence of occurrence Compared with a full rate architecture, the half rate architecture of the DFE according to embodiments of the invention may significantly reduce the power consumption because the summer is the most power-consuming component in the DFE and an alternative implementation of clocked even/odd summers may suffer from additional clocking power and turn on delays. In addition, such an architecture avoids any matching issues between two summers as in a full rate architecture. Furthermore, because of the half-rate architecture, the D-flip flops need to be clocked with a half-rate clock only, which results in yet another power saving over a full-rate architecture where the D-flip flops need to be operated with a full-rate clock.

Figure 5:
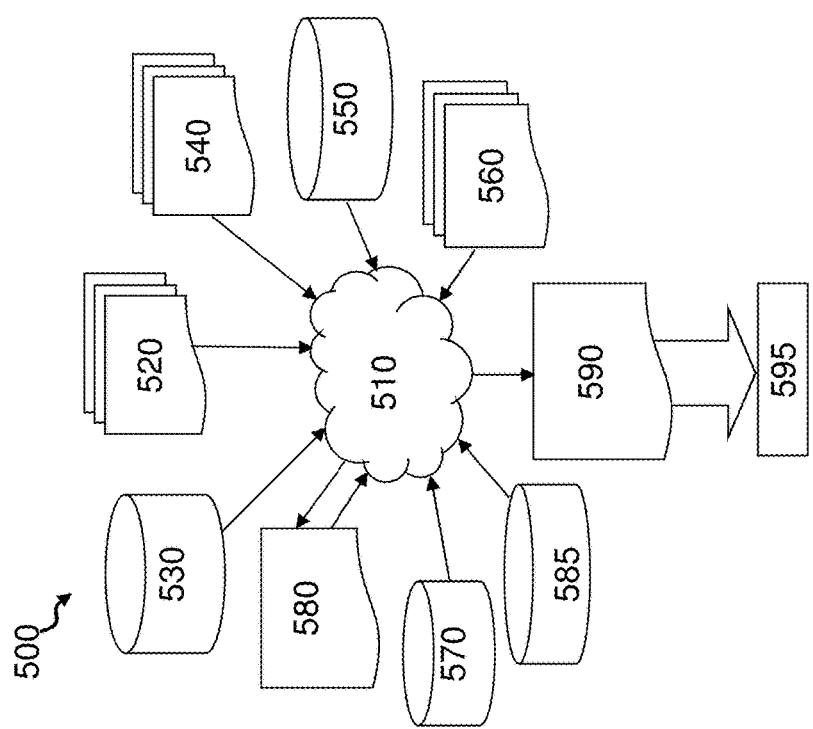
FIG. 5 shows a block diagram of an exemplary design flow used for example, in semiconductor IC logic design, simulation, test, layout, and manufacture.

FIG. 5 shows a block diagram of an exemplary design flow 500 used for example, in semiconductor IC logic design, simulation, test, layout, and manufacture. Design flow 500 includes processes, machines and/or mechanisms for processing design structures or devices to generate logically or otherwise functionally equivalent representations of the design structures and/or devices described above and shown e.g. in FIGS. 1, 2, 3 and 4. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by ALTERA® Inc. or XILINX® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 1, 2 and 5. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 1, 2, 3 and 4 to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, 3 and 4. In one embodiment, design structure 590 may comprise a compiled, executable HDL simulation model that functionally simulates the devices shown in FIGS. 1, 2, 3 and 4.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, 3 and 4. Design structure 590 may then proceed to a stage 595 where, for example, design structure 590: proceeds to tape-out, is released to manufacturing, is released to a mask house, is sent to another design house, is sent back to the customer, etc.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A decision feedback equalizer configured for a half-rate operation, the decision feedback equalizer comprising:
   a single summer stage in a main path, the main path comprising a 2:1 multiplexer configured to multiplex even data and odd data into an output signal of the decision feedback equalizer;
   a direct feedback path configured to provide feedback to the single summer stage;
   an even sampler configured to sample the even data of an output signal of the single summer stage;
   an odd sampler configured to sample the odd data of the output signal of the single summer stage; and
   a plurality of additional 2:1 multiplexers arranged in the direct feedback path and being configured to feed the even and odd data in an alternating manner back to the single summer stage, thereby adapting the feedback to the half-rate operation of the decision feedback equalizer.

2. The decision feedback equalizer according to claim 1, wherein the direct feedback path comprises a first string of delay units for the even data and a second string of delay units for the odd data, wherein the first string of delay units and the second string of delay units are configured to operate at half rate.

3. The decision feedback equalizer according to claim 2, wherein the delay units are D flip-flops.

4. The decision feedback equalizer according to claim 1, wherein the direct feedback path comprises a plurality of weighting units for weighting the feedback.

5. The decision feedback equalizer according to claim 1, configured to receive a half rate clock signal;
   to clock the even sampler with an in-phase component corresponding to a first edge of the half rate clock signal; and to clock the odd sampler with an out-of-phase component corresponding to a complementary edge of the half rate clock signal.

6. The decision feedback equalizer according to claim 1, configured to receive a half rate clock signal, wherein the plurality of 2:1 multiplexers of the direct feedback path are clocked in an alternating manner with the in-phase component of the half rate clock signal and the out-of-phase component of the half rate clock signal.

7. The decision feedback equalizer according to claim 1, configured to receive a half rate clock signal, wherein the delay units of the first string and the delay units of the second string are clocked in an alternating manner with the in-phase component of the half rate clock signal and the out-of-phase component of the half rate clock signal.

8. The decision feedback equalizer according to claim 1, wherein the single summer stage comprises a resistor-based summer, the resistor-based summer comprising
 a main stage configured to convert an input voltage to a current;
 a plurality of tap stages configured to provide a weighted feedback signal from the delay stages, wherein each of the tap stages comprise
  a first differential pair configured to provide a tap sign-bit; and
  a second and a third differential pair connected to the main stage with opposite polarity and configured to add or subtract current to the respective tap stage in dependence on the sign-bit.

9. The decision feedback equalizer according to claim 1, wherein the main stage of the summer comprises
 a differential pair;
 a current source coupled between the sources of the differential pair and ground; and
 a single, ground-referenced capacitor for source degeneration and gain peaking in parallel to the current source.

10. The decision feedback equalizer according to claim 1, wherein the even sampler and the odd sampler each comprise a serial connection of a slicer and a set-reset latch.

11. The decision feedback equalizer according to claim 10, wherein the slicer comprises
 an amplifier stage clocked by a half-rate clock; and
 a comparator stage, the comparator stage being self-timed.

12. A memory system, comprising a memory controller, a memory module and a memory bus arranged between the memory controller and memory module, wherein the memory controller comprises a decision feedback equalizer according to claim 1.

13. The memory system according to claim 12, comprising
 a level shifter configured to convert a voltage level of the memory module to a logic voltage level of memory logic of the memory controller, wherein the decision feedback equalizer is configured to operate with the logic voltage level.

14. The memory system according to claim 13, further comprising
 a preamplifier arranged between the level shifter and the decision feedback equalizer, wherein the level shifter comprises a source follower and a variable resistive voltage divider for adapting the common mode of the data signal to an input range of the preamplifier.

15. The memory system according to claim 12, wherein the memory module is a double data rate (DDR) memory module.

16. The memory system according to claim 12, wherein the memory system is configured to operate according to the JEDEC DDR-5 standard.

17. A design structure tangibly embodied in a non-transitory machine readable medium for designing, manufacturing, or testing an integrated circuit, the design structure comprising:
 a decision feedback equalizer configured for a half-rate operation, the decision feedback equalizer comprising:
 a single summer stage in a main path comprising a 2:1 multiplexer configured to multiplex even data and odd data into an output signal of the decision feedback equalizer;
 a direct feedback path configured to provide feedback to the single summer stage;
 an even sampler configured to sample the even data of an output signal of the single summer stage;
 an odd sampler configured to sample the odd data of the output signal of the single summer stage; and
 a plurality of additional 2:1 multiplexers arranged in the direct feedback path and being configured to feed the even and odd data back to the single summer stage, thereby adapting the feedback to the half-rate operation of the decision feedback equalizer.

18. The design structure according to claim 17, wherein the direct feedback path comprises a first string of delay units for the even data and a second string of delay units for the odd data, wherein the first string of delay units and the second string of delay units are configured to operate at half rate.

\* \* \* \* \*